(12) United States Patent
O'Leary

(10) Patent No.: US 6,731,161 B1
(45) Date of Patent: May 4, 2004

(54) METHOD FOR MEASURING THE FREQUENCY RESPONSE OF A TRANSIMPEDANCE AMPLIFIER PACKAGED WITH AN INTEGRATED LIMITER

(75) Inventor: Mark O'Leary, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 10/295,065

(22) Filed: Nov. 15, 2002

(51) Int. Cl.[7] ............................................... G01R 19/00

(52) U.S. Cl. ........................... 330/2; 714/700; 341/143

(58) Field of Search ........................... 330/2; 714/700; 341/143, 138, 200, 77

(56) References Cited

U.S. PATENT DOCUMENTS 6,480,129 B1 * 11/2002 Melanson ................... 341/143

\* cited by examiner

Primary Examiner—Michael B Shingleton
(74) Attorney, Agent, or Firm—INCAPLAW; Terrance A. Meador

(57) ABSTRACT

An integrated device having a transimpedance amplifier (TIA) cascaded with a limiter can be tested such that the frequency response of the TIA is accurately measured. The frequency response of the TIA is derived from the measured output jitter response of the integrated TIA/limiter device. In a practical testing system, a sinusoidal test signal having a constant amplitude is combined with a broadband noise signal having a constant power level to obtain a noisy test signal. The TIA/limiter is driven by the noisy test signal while the frequency of the test signal is varied. The output jitter of the TIA/limiter is measured for a number of frequency settings to obtain the output jitter response.

27 Claims, 6 Drawing Sheets

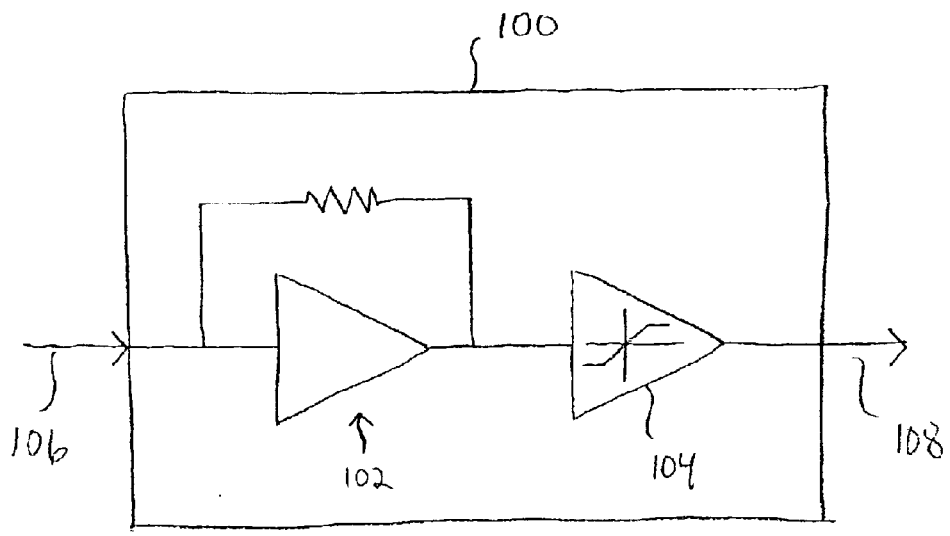
FIG. 1 - PRIOR ART
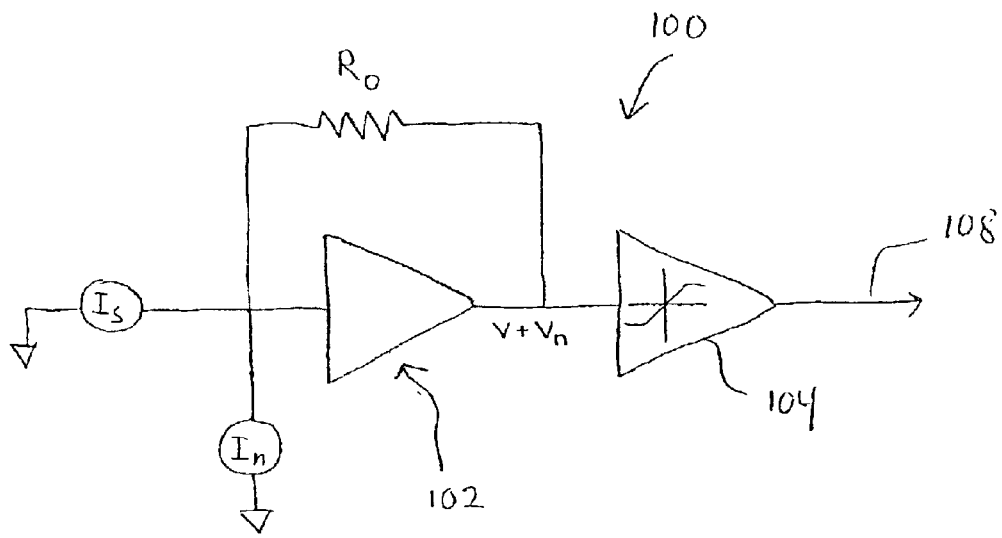
FIG. 7

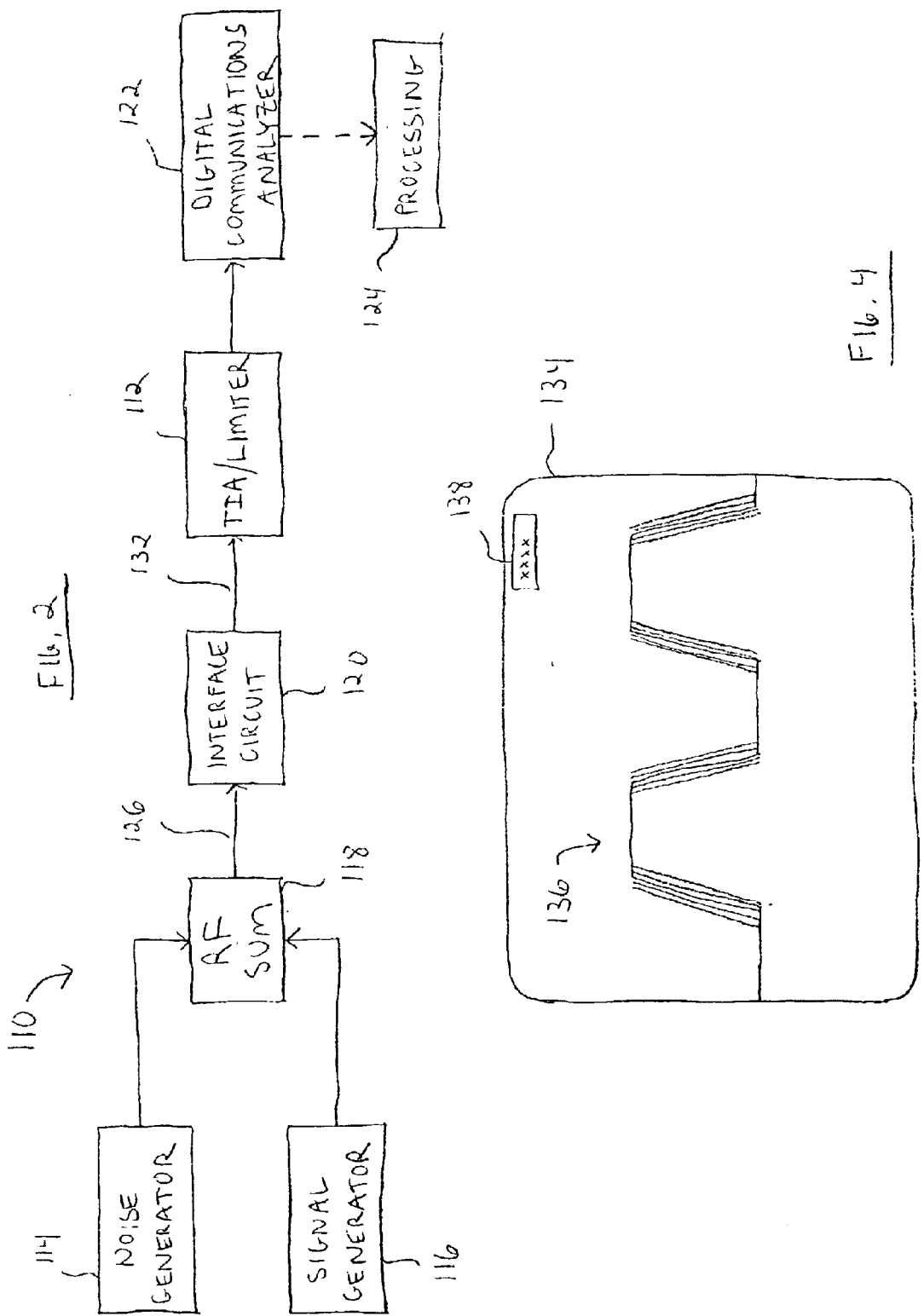

METHOD FOR MEASURING THE FREQUENCY RESPONSE OF A TRANSIMPEDANCE AMPLIFIER PACKAGED WITH AN INTEGRATED LIMITER

FIELD OF THE INVENTION

The present invention relates generally to testing techniques for electronic devices. More particularly, the present invention relates to a technique for measuring the frequency response of a transimpedance amplifier.

BACKGROUND OF THE INVENTION

A transimpedance amplifier (TIA) operating on the output of a photodiode forms a fiber-optic receiver. In data applications, the output of the TIA is limited and subsequently processed by a clock and data recovery unit to obtain the original data. In such a system, the bandwidth of the TIA plays an important role. If the bandwidth is too narrow, the data will be corrupted by intersymbol interference. If the bandwidth is too wide, the TIA will generate excess noise that can also corrupt the data. From a communications theory viewpoint, the TIA bandwidth should be matched to that of the data channel.

For practical reasons, it is desirable to include the TIA and the limiter in a single integrated circuit (IC) device. For example, FIG. 1 is a schematic diagram of an IC package 100 having a TIA 102 and an integrated limiter 104. Such an integrated assembly is referred to herein as a TIA/limiter. The prior art contains a number of TIA/limiter designs, and the operation of TIA/limiters will not be described in detail herein. Briefly, TIA 102 generates an output that is proportional to the input current, and limiter 104 clips the TIA output signal at specific high and low voltage levels. The combined nature of an integrated TIA/limiter device makes it difficult (if not impossible) to perform direct measurements of the TIA itself (such as frequency response or bandwidth measurements).

One approach to testing the frequency response of a TIA implemented in an integrated TIA/limiter device is to include a TIA output test pin on the IC package. With such a configuration, conventional frequency response testing of the TIA is possible. However, an additional test pin can be difficult to implement and costly in terms of physical space, die size, and power requirements (such a test pin would consume unnecessary power because it would need to drive 50 Ohm test equipment).

A common method of testing the TIA bandwidth for an integrated TIA/limiter performs a low-level frequency response test on the TIA/limiter device. First, the test signal input level is reduced until the limiter is operating in the linear region. Then, conventional frequency response measurements are obtained with a spectrum analyzer and tracking generator combination, S-parameter test equipment, or a signal generator combined with a spectrum analyzer. Thus, the TIA bandwidth is measured in cascade with another linear system (the limiter). The frequency response of the limiter causes the measured bandwidth to be lower than the actual bandwidth of the TIA alone. The measured result is inaccurate because the limiter circuit normally operates in the nonlinear limiting mode, which does not significantly degrade the TIA bandwidth. In addition, the reduction of the test signal level results in a lower signal-to-noise ratio and noisy output measurements.

Another known technique for testing the bandwidth of a TIA implemented in an integrated TIA/limiter is set forth in a draft IEEE standard relating to Ethernet network systems (IEEE Standard 802.3-2002). This IEEE standard describes a test for an optical receiver module that includes a photodiode, a TIA, and a limiter. In summary, the test method is performed according to the following generalized steps: (1) sum a tone from an RF signal generator with a suitable data source; (2) with the RF tone set at the midband, adjust the powers of the RF tone and the data signal to provide a suitable bit error rate (BER); (3) change the RF tone frequency and vary the RF tone power to provide the same fixed BER; and (4) repeat the above steps for a number of frequencies to obtain the frequency response. The rolloff in the TIA frequency response corresponds to the increase in RF tone power as the frequency increases. Unfortunately, the IEEE testing technique is time consuming because several BER measurements must be taken to find the proper RPF power setting that yields the fixed BER at the given test frequency. If very accurate test data is desired, then the number of individual BER measurements at each frequency must be increased. In addition, BER test equipment can be expensive and difficult to operate.

Accordingly, a need exists for an accurate and effective technique to measure the TIA bandwidth in an integrated TIA/limiter device.

BRIEF SUMMARY OF THE INVENTION

A testing technique according to the present invention can be utilized to test the frequency response of a TIA packaged with an integrated limiter, even though the integrated device lacks a TIA output pin. The testing technique can drive the TIA/limiter device at normal operating levels where the limiter functions in the nonlinear region. In this regard, the frequency response measurement is not affected by the operation of the limiter.

The above and other aspects of the present invention may be carried out in one form by a method of testing a transimpedance amplifier packaged with an integrated TIA/limiter. The method involves driving the TIA/limiter with a noisy input signal, obtaining a measured output jitter response of the TIA/limiter as a function of frequency of the noisy input signal, and deriving a frequency response of the TIA/limiter from the measured output jitter response.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

FIG. 1 is a schematic diagram of a device having a transimpedance amplifier and an integrated limiter (TIA/limiter);

FIG. 2 is a block diagram of a TIA/limiter test system;

FIG. 4 represents a display corresponding to an example TIA/limiter output waveform;

FIG. 7 is an alternate schematic diagram of the device shown in FIG. 1; and

DETAILED DESCRIPTION OF A PREFERRED EMBODIMENT

Figure 3:
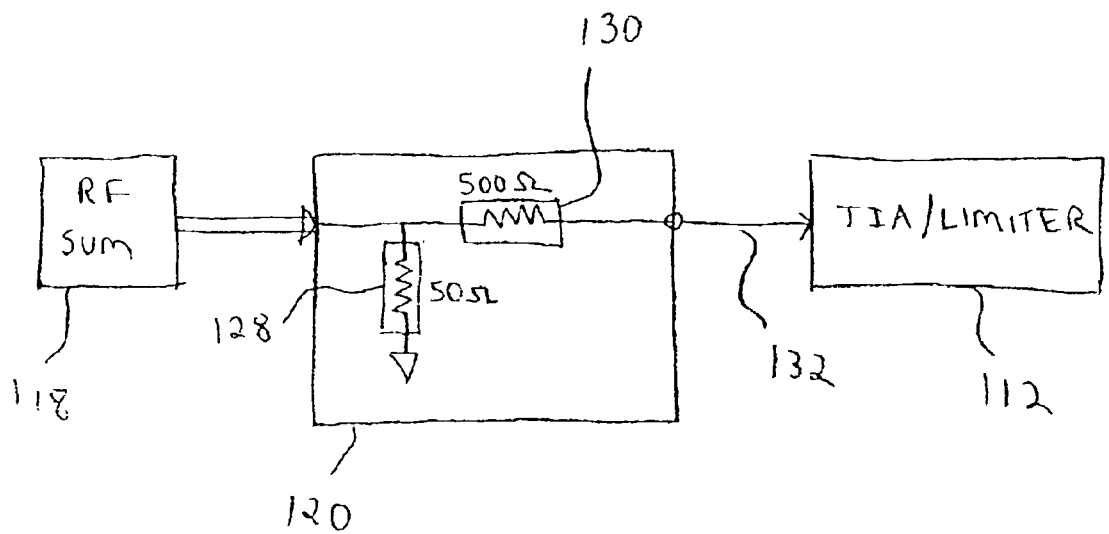
FIG. 3 is a block diagram of an interface circuit suitable for use with the test system shown in FIG. 2.

An integrated TIA/limiter device 100 includes a TIA 102 cascaded with a limiter 104 (see FIG. 1). TIA/limiter device 100 converts the current associated with an input signal 106 into a suitably limited output signal 108. For purposes of this description, the intermediate output of TIA 102 is not directly accessible or measurable via an external output pin of TIA/limiter device 100. In a practical implementation, output signal 108 can be measured via one or more external output pins. Although not depicted as such, the output of TIA/limiter 100 is typically realized as a differential output.

FIG. 2 is a block diagram of a TIA/limiter test system 110 capable of measuring the frequency response of a TIA within a TIA/limiter device 112, which may be configured as shown in FIG. 1. Briefly, test system 110 includes a broadband noise generator 114, a test signal generator 116, an RF summer 118, an interface circuit 120, and a digital communications analyzer 122. Test system 110 may also employ any number of elements, routines, components, or procedures related to the processing of data (identified by reference number 124).

Broadband noise generator 114 generates a substantially white noise signal having a desired average power level. The spectral characteristics of the noise signal, the level of the noise signal, and other characteristics of the noise signal can be adjusted by the user. Any number of conventional "off the shelf" noise generators may be suitable for use in test system 110. For example, one suitable noise generator is currently available from Noise Com (a subsidiary of Wireless Telecom Group, Inc.) as model number NC6000. Signal generator 116 generates a periodic test signal, e.g., a sinusoidal signal, having certain voltage and frequency characteristics. As described in more detail below, the particular settings for signal generator 116 may be determined by the configuration of the TIA/limiter device under test. Signal generator 116 is capable of varying both the test signal level and the test signal frequency in accordance with the testing techniques described herein. Any number of conventional "off the shelf" signal generators may be suitable for use in test system 110. For example, suitable signal generators are currently available from Agilent Technologies under the ESG product designator.

For a practical high speed application, signal generator 116 generates RF test signals at frequencies between 1 GHz and 10 GHz. RF summer 118 combines the output of noise generator 114 with the output of signal generator 116. RF summer 118 employs conventional techniques to sum the two signals into a noisy test signal 126. In a practical embodiment, RF summer 118 should be selected such that it matches or accommodates the frequency range of the signal generator. The noisy test signal 126 is routed to interface circuit 120, which provides a termination load for the test equipment. Interface circuit 120 also provides a known conversion from voltage to current (because the TIA operates on a current input).

FIG. 3 is a block diagram of an example interface circuit 120 suitable for use with the test system shown in FIG. 2. Of course, alternatively configured interface circuits may be employed in lieu of the circuit shown in FIG. 3. Interface circuit 120 can be designed for compatibility with the test equipment, e.g., RF summer 118, noise generator 114, or signal generator 116, and/or for compatibility with the particular TIA/limiter under test. Interface circuit 120 includes a load resistor 128 and a series resistor 130. Load resistor 128 is connected between the input of interface circuit 120 and ground such that load resistor 128 provides a matching input load termination. FIG. 3 illustrates a practical embodiment having a 50 Ohm load resistor 128, which matches the standard 50 Ohm output impedance of most electronic test equipment. Series resistor 130 is connected between the input and output of interface circuit 120. Series resistor 130 serves as a reference for the conversion between the test signal voltage and current. In the example embodiment, series resistor 130 is 500 Ohms (the large resistance relative to the 50 Ohm load resistor 128 does not significantly affect the overall input impedance seen by RF summer 118).

In a practical embodiment, noisy input signal 126 (see FIG. 1) is carried by a suitable RF conductor, e.g., a coaxial cable. The output signal 132 of interface circuit 120 may be carried by any suitable conductive element or arrangement that is compatible with the input of TIA/limiter 112. For example, interface circuit 120 may include a coplanar waveguide output section that matches a coplanar waveguide input section of TIA/limiter 112.

Digital communications analyzer 122 performs a number of digital diagnostics and measurements. For example, digital communications analyzer 122 is capable of measuring and displaying a waveform that represents the digital output of TIA/limiter 112. In addition, digital communications analyzer 122 is capable of measuring and displaying the jitter associated with the output signal of TIA/limiter 112. In this regard, FIG. 4 represents a display 134 corresponding to an example TIA/limiter output waveform 136. The flat horizontal portions of waveform 136 represent the effect of the limiter, and the "undefined" or "blurry" rising and falling edges represent output jitter. In addition, the display 134 (or another element of digital communications analyzer 122) may include a field 138 that displays a jitter measurement. In practice, digital communications analyzer 122 may be an oscilloscope configured with suitable digital analysis software for statistically measuring jitter. Thus, any number of conventional "off the shelf" analyzers may be suitable for use in test system 110. For example, one suitable analyzer is the HP83480A Digital Signal Analyzer from Hewlett-Packard.

As described in more detail below, data obtained by digital communications analyzer 122 may be processed in accordance with any number of routines, techniques, and procedures (which may be automated and/or controlled by a human operator). For example, the results obtained by digital communications analyzer 122 may be processed by a suitably configured computer program to obtain the frequency response of the TIA.

An alternate test system (not shown) can be employed where the TIA produces a suitable amount of self-generated noise. If the TIA generates a sufficient amount of self-noise, then noise generator 114 and RF summer need not be utilized. In other words, only the output of signal generator 116 feeds interface circuit 120. This alternative testing technique is described in detail below.

Figure 5:
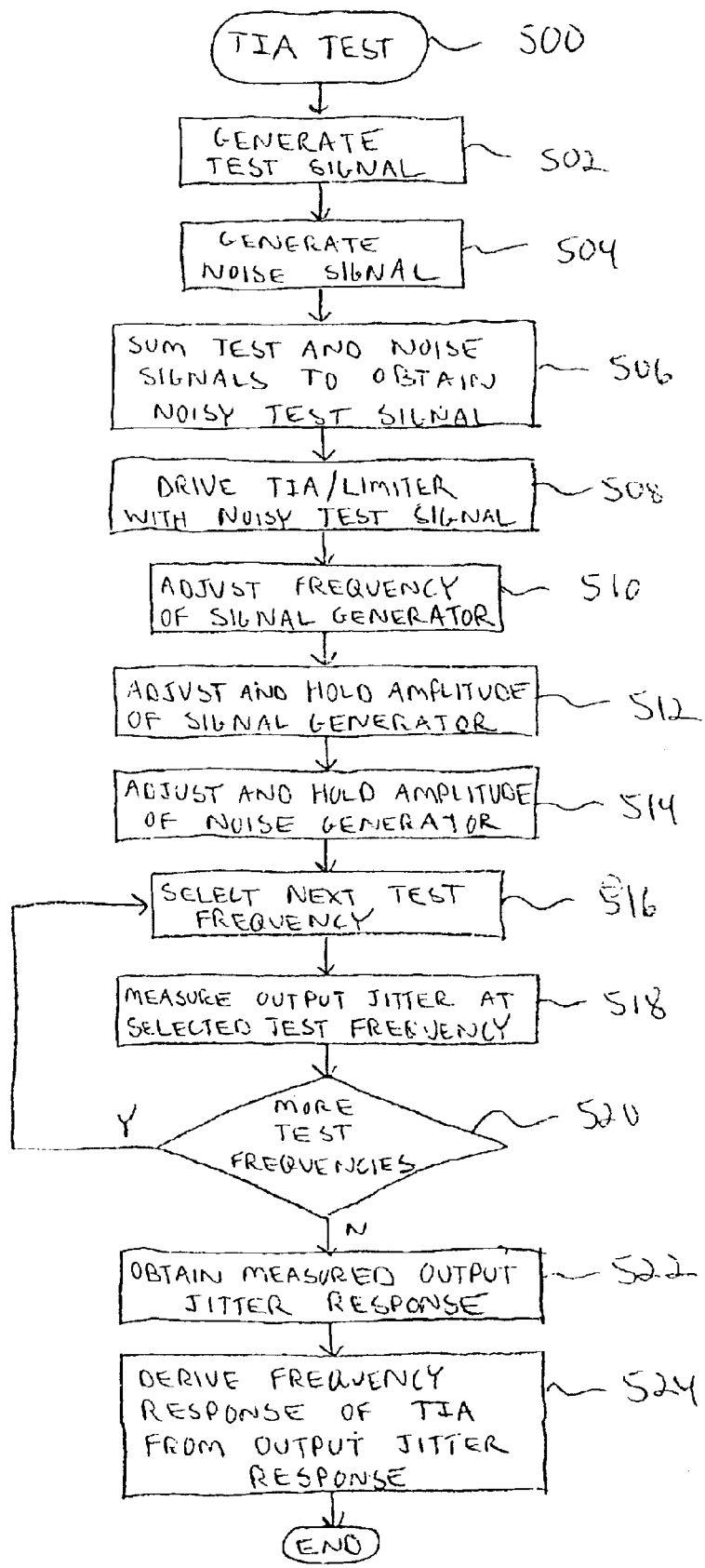
FIG. 5 is a flow diagram of a TIA test process.

FIG. 5 is a flow diagram of a TIA test process 500 according to the present invention. Process 500 can be performed to measure the frequency response of a TIA included in an integrated TIA/limiter device. An appropriate test signal is generated (task 502) by, e.g., a suitable signal generator. In the preferred embodiment, the test signal is periodic and sinusoidal. An appropriate noise signal is also generated (task 504) by, e.g., a suitable noise generator. In the preferred embodiment, the noise signal is broadband in nature and it approximates a Gaussian white noise signal. The test signal and the noise signal are summed (task 506) or otherwise combined to obtain a noisy test signal. The TIA/limiter device is ultimately driven with the noisy test signal or some signal derived from the noisy test signal (task 508).

In practice, the testing conditions can be initialized to increase the accuracy of the measurements. For example, the frequency of the signal generator can be adjusted (task 510) to vary the frequency of the test signal. The frequency of the test signal may be initially set to the midband frequency of the TIA such that the TTA is operating in a normal manner. In this regard, the midband frequency may vary depending upon the particular TIA/limiter under test. The signal generator may also be adjusted and held to generate the test signal at a substantially constant amplitude (task 512). The constant amplitude of the test signal is maintained throughout the test regardless of the frequency of the test signal. The amplitude is adjusted to emulate normal operating conditions for the TIA/limiter (the TIA operating in the linear region and the limited output well clipped). As depicted in FIG. 4, an operator can view the display of the digital communications analyzer to determine whether the device output has been limited or clipped. The noise generator may also be adjusted and held to generate a noise signal having a substantially constant average power level. The noise level is selected to produce a midrange and easily measured output jitter (task 514). For example, the noise level may be adjusted to provide an output jitter within the range of 0.1–0.4 unit interval (UI). Once these initial values are set, the TIA input current associated with the test signal component and the TIA input current associated with the noise signal component are both known and constant throughout the test measurements.

After initializing the noisy test signal, a test frequency is selected (task 516) and the corresponding output jitter at that frequency is measured (task 518). In a practical test system, the output jitter can be measured in units of time (e.g., seconds) or in UI units (which is the jitter measured in seconds divided by the period for the given data rate or frequency). If more test frequencies remain (query task 520), then the next frequency is selected and the corresponding output jitter is recorded. Any number of frequencies and measured jitter values can be obtained in this manner. In practice, the frequency variations can be controlled by a suitable controller and the jitter measurements can be automatically recorded by the digital communications analyzer and/or by any suitable recording device or mechanism, e.g., a computer connected to the digital communications analyzer. Alternatively, the frequency of the test signal can be manually adjusted and the jitter measurements can be manually recorded.

Eventually, the test procedure obtains a number of jitter measurements taken at a number of test signal frequencies. A plurality of the individual jitter measurements can be combined to obtain a measured output jitter response $J(\omega)$ for the TIA/limiter device under test (task 522). The output jitter response represents the jitter as a function of frequency of the noisy input test signal. As explained in more detail below, the frequency response of the TIA is mathematically related to the measured output jitter. Accordingly, TIA test process 500 ends by deriving the frequency response of the TIA from the output jitter response (task 524).

The frequency response of the TIA is inversely proportional to the measured output jitter response, and the frequency response is derived according to the relationship $$f(\omega) = K \frac{1}{\sin(2\pi J(\omega))},$$

where K represents a constant and $J(\omega)$ represents the measured output jitter response. In practice, K represents the ratio of the test signal current to the noise signal current, both of which remain substantially constant throughout the test. In this regard, K represents a characteristic of the test signal, a characteristic of the noise signal, and/or a characteristic of the combined noisy test signal. Since K remains constant during the test, absolute knowledge of the noise signal level or the test signal level is unnecessary. If the measured output jitter values are small enough (e.g., less than approximately 0.3 UI), then the frequency response of the TIA can be derived according to the relationship $$f(\omega) \cong K \frac{1}{2\pi J(\omega)}.$$

The frequency response of the TIA can be analyzed to determine the −3 dB bandwidth of the TIA, the frequency rolloff slope of the TIA, and other frequency dependent characteristics of the TIA.

Figure 6:
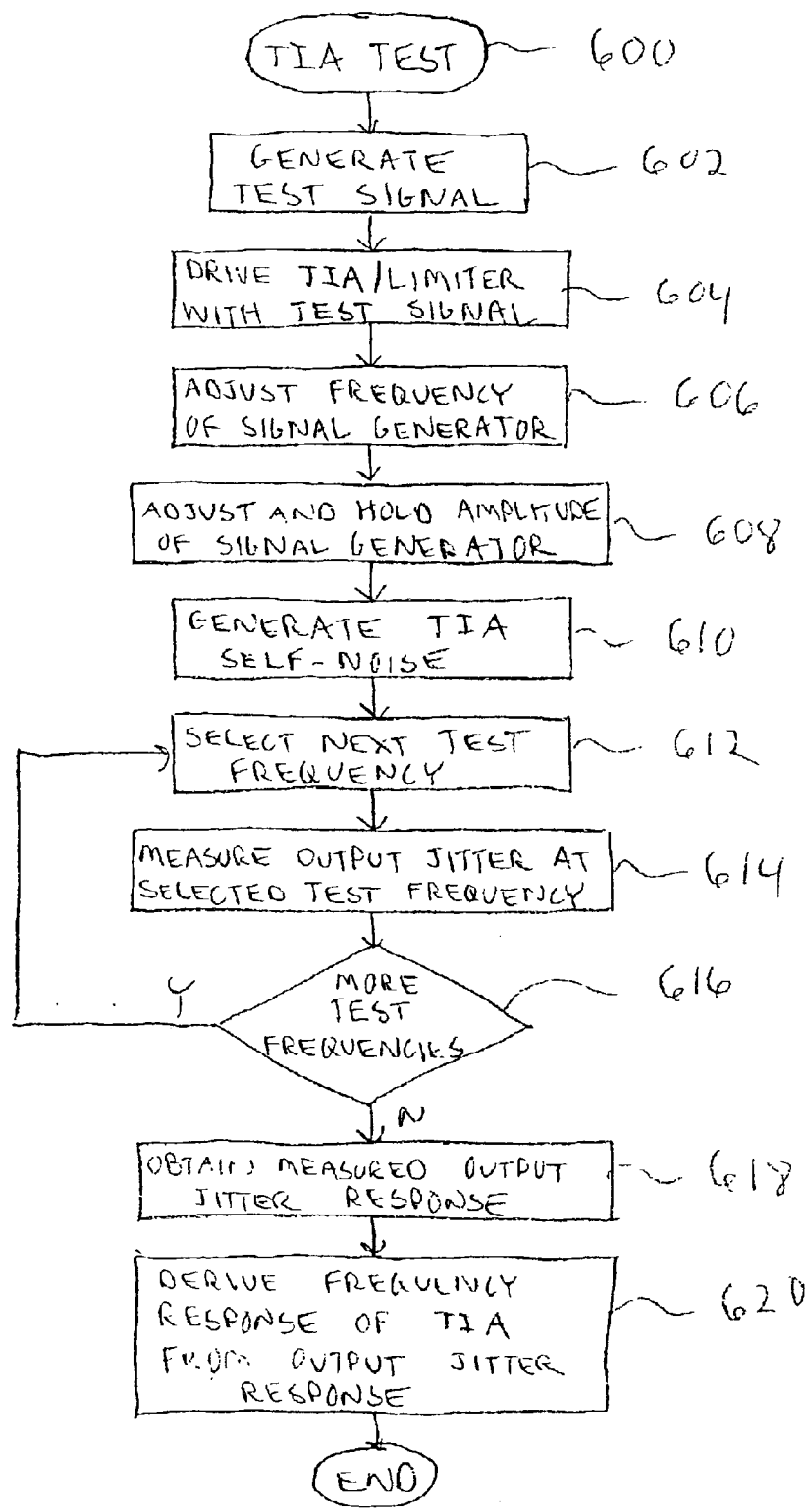
FIG. 6 is a flow diagram of an alternate TIA test process.

FIG. 6 is a flow diagram of an alternate TIA test process 600 according to the present invention. Process 600 can be performed to measure the frequency response of a noisy TIA included in an integrated TIA/limiter device, where the TIA generates self-noise while operating. In contrast to TIA test process 500, process 600 need not employ a noise generator. Rather, process 600 can rely on the self-noise generated by the TIA itself. Initially, an appropriate test signal is generated (task 602) by, e.g., a suitable signal generator. In the preferred embodiment, the test signal is periodic and sinusoidal. The TIA/limiter device is ultimately driven with a test signal that includes the clean test signal combined with the TIA self-noise (task 604). In this context, the self-noise can be conceptualized as being introduced at the input of the TIA within the device.

In practice, the testing conditions can be initialized to increase the accuracy of the measurements. For example, the frequency of the signal generator can be adjusted (task 606) to initialize the frequency of the test signal. As mentioned above, the frequency of the test signal may be initially set to the midband frequency of the TIA. The signal generator may also be adjusted and set to generate the test signal at a substantially constant amplitude (task 608) throughout the test. The amplitude is adjusted to emulate normal operating conditions for the TIA/limiter (the TIA operating in the linear region and the limited output well clipped). Under normal operating conditions and under the test conditions, the TIA generates self-noise in response to the input test signal (task 610).

Following task 610, the remainder of TIA test process 600 is identical to the corresponding portion of TIA process 500. In this regard, tasks 612, 614, 616, 618, and 620 correspond to tasks 516, 518, 520, 522, and 524, respectively. Thus, process 600 proceeds to obtain the measured output jitter response of the TIA/limiter device (task 618) and derives the frequency response of the TIA from the output jitter response (task 620).

As described above, the frequency response of the TIA can be derived according to the relationship $$f(\omega) = K \frac{1}{\sin(2\pi J(\omega))},$$

where K represents a constant and $J(\omega)$ represents the measured output jitter response. If the measured output jitter values are small enough, then the frequency response of the TIA can be derived according to the relationship $$f(\omega) \cong K \frac{1}{2\pi J(\omega)}.$$

In practice, K represents the ratio of the test signal current to the self-noise signal current, both of which remain substantially constant throughout the test. For this reason, absolute knowledge of either the noise signal level or the test signal level is unimportant. In this regard, the RMS jitter depends only on the integral of the self-noise via Parseval's theorem equating power in the frequency and time domains. Consequently, the spectrum of the noise is unimportant because the spectrum of the jitter is unimportant.

The derivation of the TIA frequency response from the output jitter response of the TIA/limiter device is an important aspect of the present invention. Generally, the principle of the testing technique relies on the fact that the integrated noise output of the TIA is substantially the same throughout the test, while the signal output of the TIA becomes attenuated according to the frequency response of the TIA. Using a sinusoidal test signal, the conversion between measured output jitter and test signal level at the TIA output is known. Consequently, the TIA frequency response can be indirectly measured by analyzing the output jitter.

FIG. 7 is an alternate schematic diagram of the device shown in FIG. 1. FIG. 7 illustrates a theoretical model of TIA/limiter device 100, which includes TIA 102 and limiter 104. $I_s$ represents the RMS test signal current at the TIA input, $I_n$ represents the RMS noise signal current at the TIA input, $R_0$ represents the midband (maximum) transimpedance of TIA 102, v represents the test signal voltage at the output of TIA 102, and $v_n$ represents the noise voltage at the output of TIA 102.

Figure 8:
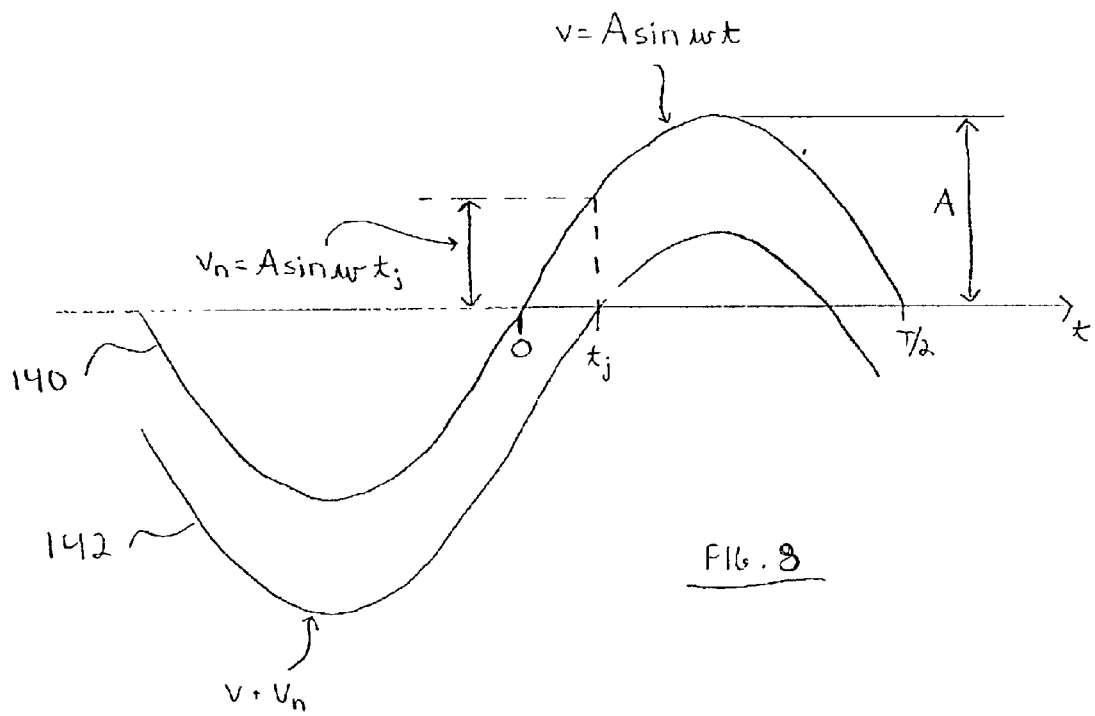
FIG. 8 and FIG. 9 are graphs showing test signal waveforms and corresponding noisy test signal waveforms.

FIG. 8 is a graph of a test signal waveform 140 and a corresponding noisy test signal waveform 142 representing the output of a TIA in an integrated TIA/limiter device. Waveform 140 represents the "pristine" output signal voltage v, while waveform 142 represents the noisy output signal voltage (v+$v_n$). For purposes of this derivation, TIA 102 is assumed to be operating in the linear region and the output voltage v is assumed to be sinusoidal. In addition, as shown in FIG. 8, the frequency of the noise is assumed to be much lower than the frequency of the test signal such that a noise disruption is substantially constant over one period of the test signal. This characteristic is depicted in FIG. 8 by a constant noise voltage offset in amplitude between waveforms 140, 142.

Figure 9:
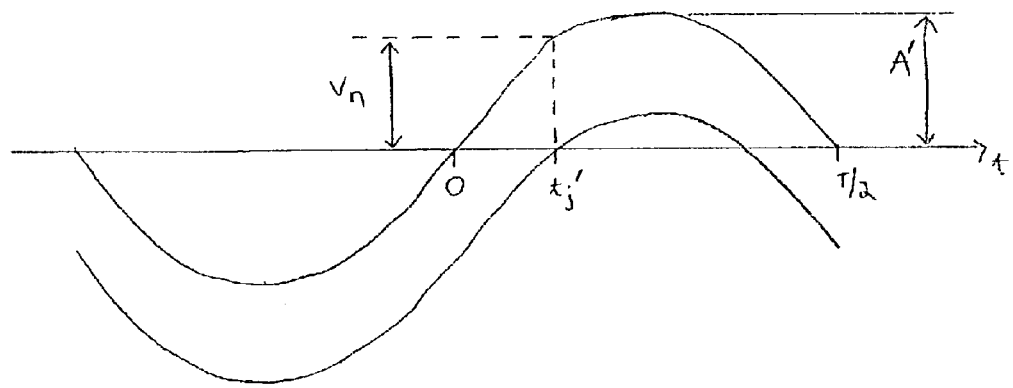

The output jitter ($t_j$) in FIG. 8 indicates the time shift of the positive-going zero crossing that is caused by the noise. As shown in FIG. 8, the zero crossing for the output signal voltage v occurs at time t=0, while the zero crossing for the noisy output signal voltage has been displaced. FIG. 8 illustrates that there is a mathematical relationship between the noise displacement (the noise voltage $v_n$) and the amount of measured jitter. As the frequency of the test signal is increased and the frequency response of the TIA attenuates the TIA output, the measured jitter increases (see FIG. 9). The jitter increases because the amplitude of the noise voltage signal $v_n$ remains substantially constant over frequency. In FIG. 9, the amplitude of the TIA output voltage v is less than the corresponding amplitude shown in FIG. 8. However, the offset caused by $v_n$ is the same, thus resulting in an increase in the zero crossing time for the noisy output signal voltage (v+$v_n$), which occurs at time $t_j'$ rather than at time $t_j$ as shown in FIG. 8.

The derivation of the relationship for converting the output jitter response into the TIA frequency response will now be described with reference to FIGS. 7–9. The clean TIA output signal voltage can be represented by the following relationship: v=$I_s R_0 f(\omega)$sin $\omega$t (equation 1). As used herein, f($\omega$) represents the TIA frequency response, where the maximum value of f($\omega$) is 1.0 and where R($\omega$)=$R_0 f(\omega)$. Referring to FIG. 8, the noise voltage is related to the time jitter as follows: $v_n(t)=I_s R_0 f(\omega)$sin $\omega t_j$ (equation 2). As used herein, $t_j$ represents the measured output jitter in seconds. The noise voltage at the TIA output can be represented by the following relationship: $v_n=I_n R_0$ (equation 3). Substituting equation 3 into equation 2, the TIA frequency response can be expressed as:

$$f(\omega) = \frac{I_n}{I_s \sin \omega t_j}$$

(equation 4).

The measured output jitter can also be expressed in UI rather than in seconds. The conversion relationship is as follows $$\frac{t_j}{T} = J, \text{ or } t_j = \frac{2\pi J}{\omega}$$

(equation 5), where $t_j$ and T are expressed in seconds and J is expressed in UI. In equation 5, T represents the period of the test signal (see FIG. 8) and J represents the measured output jitter. Using equation 5, equation 4 becomes $$f(\omega) = \frac{I_n}{I_s \sin(2\pi J(\omega))}$$

(equation 6). If the output jitter is relatively small, then equation 6 can be expressed in an equivalent approximate form as:

$$f(\omega) = \frac{I_n}{I_s 2\pi J(\omega)}$$

equation 7). Equation 6 and equation 7 are utilized to derive the TIA frequency response from the output jitter response, as described above.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. A method of testing a transimpedance amplifier packaged with an integrated limiter (TIA/limiter), said method comprising:
    driving said TIA/limiter with a noisy input signal;
    obtaining a measured output jitter response of said TIA/limiter as a function of frequency of said noisy input signal; and
    deriving a frequency response of said TIA/limiter from said measured output jitter response.

2. A method according to claim 1, further comprising the step of generating said noisy input signal with a periodic test signal and a broadband noise signal.

3. A method according to claim 2, wherein said noisy input signal has a substantially constant amplitude.

4. A method according to claim 2, wherein said broadband noise signal has a substantially constant average power.

5. A method according to claim 1, wherein said frequency response is inversely proportional to said measured output jitter response.

6. A method according to claim 5, wherein said frequency response is derived according to the relationship $$f(\omega) = K \frac{1}{\sin(2\pi J(\omega))},$$

where K represents a constant and J($\omega$) represents said measured output jitter response.

7. A method according to claim 6, wherein K represents a characteristic of said noisy input signal.

8. A method according to claim 5, wherein said frequency response is derived according to the relationship $$f(\omega) \cong K \frac{1}{2\pi J(\omega)},$$

where K represents a constant and J($\omega$) represents said measured output jitter response.

9. A method according to claim 8, wherein K represents a characteristic of said noisy input signal.

10. A method of testing a transimpedance amplifier packaged with an integrated limiter (TIA/limiter), said method comprising:

generating a periodic test signal;

generating a noise signal;

summing said test signal with said noise signal to obtain a noisy input signal;

driving said TIA/limiter with said noisy input signal;

measuring output jitter values of said TIA/limiter at a plurality of test frequencies for said periodic test signal; and deriving a frequency response of said TIA/limiter from a number of said output jitter values.

11. A method according to claim 10, wherein said periodic test signal is generated with a substantially constant amplitude.

12. A method according to claim 10, wherein said periodic test signal is sinusoidal.

13. A method according to claim 10, wherein said noise signal is generated with a substantially constant average power.

14. A method according to claim 10, further comprising obtaining a measured output jitter response of said TIA/limiter from a number of said output jitter values.

15. A method according to claim 14, wherein said frequency response is derived according to the relationship $$f(\omega) = K \frac{1}{\sin(2\pi J(\omega))},$$

where K represents a constant and J($\omega$) represents said measured output jitter response.

16. A method according to claim 15, wherein:

said periodic test signal has a signal current;

said noise signal has a noise current; and

K represents a ratio of said noise current to said signal current.

17. A method according to claim 14, wherein said frequency response is derived according to the relationship $$f(\omega) \cong K \frac{1}{2\pi J(\omega)},$$

where K represents a constant and J($\omega$) represents said measured output jitter response.

18. A method according to claim 17, wherein:

said periodic test signal has a signal current;

said noise signal has a noise current; and

K represents a ratio of said noise current to said signal current.

19. A method of testing a noisy transimpedance amplifier packaged with an integrated limiter (TIA/limiter), said method comprising:

driving said TIA/limiter with a known test signal;

varying the frequency of said known test signal;

obtaining a measured output jitter response of said TIA/limiter as a function of frequency of said known test signal; and deriving a frequency response of said TIA/limiter from said measured output jitter response.

20. A method according to claim 19, wherein said test signal has a substantially constant amplitude.

21. A method according to claim 19, wherein said noisy transimpedance amplifier generates noise having a substantially constant average power.

22. A method according to claim 19, wherein said frequency response is derived according to the relationship $$f(\omega) = K \frac{1}{\sin(2\pi J(\omega))},$$

where K represents a constant and J($\omega$) represents said measured output jitter response.

23. A method according to claim 22, wherein K represents a characteristic of said test signal.

24. A method according to claim 23, wherein:

said test signal has a signal current;

said transimpedance amplifier generates noise having a noise current; and

K represents a ratio of said noise current to said signal current.

25. A method according to claim 19, wherein said frequency response is derived according to the relationship $$f(\omega) \cong K \frac{1}{2\pi J(\omega)},$$

where K represents a constant and J($\omega$) represents said measured output jitter response.

26. A method according to claim 25, wherein K represents a characteristic of said test signal.

27. A method according to claim 26, wherein:

said test signal has a signal current;

said transimpedance amplifier generates noise having a noise current; and

K represents a ratio of said noise current to said signal current.

* * * * *